United States Patent
Mao et al.

(10) Patent No.: US 9,570,429 B2
(45) Date of Patent: Feb. 14, 2017

(54) METHODS OF FABRICATION AND TESTING OF THREE-DIMENSIONAL STACKED INTEGRATED CIRCUIT SYSTEM-IN-PACKAGE

(71) Applicant: Shanghai Lexvu Opto Microelectronics Technology Co., Ltd., Shanghai (CN)

(72) Inventors: Jianhong Mao, Shanghai (CN); Fengqin Han, Shanghai (CN); Zhiwei Wang, Shanghai (CN); Wenfen Chang, Shanghai (CN)

(73) Assignee: SHANGHAI JADIC OPTOELECTRONICS TECHNOLOGY CO., LTD., Shanghai (CN)

( * ) Notice: Subject to any disclaimer, the term of this patent is extended or adjusted under 35 U.S.C. 154(b) by 0 days.

(21) Appl. No.: 14/694,868

(22) Filed: Apr. 23, 2015

(65) Prior Publication Data
US 2015/0311188 A1    Oct. 29, 2015

(30) Foreign Application Priority Data
Apr. 24, 2014    (CN) .......................... 2014 1 0168052

(51) Int. Cl.
*H01L 21/00* (2006.01)
*H01L 25/00* (2006.01)
(Continued)

(52) U.S. Cl.
CPC .............. *H01L 25/50* (2013.01); *H01L 24/81* (2013.01); *H01L 24/92* (2013.01); *H01L 24/94* (2013.01); *H01L 24/96* (2013.01); *H01L 24/97* (2013.01); *H01L 25/0657* (2013.01); *H01L 21/561* (2013.01); *H01L 21/565* (2013.01); *H01L 21/568* (2013.01); *H01L 22/14* (2013.01);
(Continued)

(58) Field of Classification Search
None
See application file for complete search history.

(56) References Cited

U.S. PATENT DOCUMENTS

| | | | | |
|---|---|---|---|---|
| 5,260,234 A | * | 11/1993 | Long | ................... H01L 21/4825 257/E23.054 |
| 6,335,104 B1 | * | 1/2002 | Sambucetti | ....... H01L 23/53238 257/E21.508 |

(Continued)

*Primary Examiner* — David E Graybill
(74) *Attorney, Agent, or Firm* — Muncy, Geissler, Olds & Lowe, P.C.

(57) ABSTRACT

The present invention provides a method of fabricating a 3D stacked IC SiP which includes: providing a first semiconductor wafer having a plurality of first dies formed thereon, each having a first wire bond pad and a first dielectric layer, at least a portion of the first wire bond pad is not covered by the first dielectric layer and constitutes an exposed area of the first die; providing a plurality of second dies, each having a second wire bond pad and a second dielectric layer, at least a portion of the second wire bond pad is not covered by the second dielectric layer and constitutes an exposed area of the second die different in size from that of the first die; aligning the second dies with the first dies and bonding the second dielectric layer to the first dielectric layer; plating the first semiconductor wafer bonded with the second dies.

29 Claims, 9 Drawing Sheets

(51) Int. Cl.
  *H01L 25/065* (2006.01)
  *H01L 21/56* (2006.01)
  *H01L 23/00* (2006.01)
  *H01L 21/66* (2006.01)

(52) U.S. Cl.
  CPC .............. *H01L 24/03* (2013.01); *H01L 24/05* (2013.01); *H01L 24/13* (2013.01); *H01L 24/16* (2013.01); *H01L 24/29* (2013.01); *H01L 24/32* (2013.01); *H01L 24/83* (2013.01); *H01L 2224/0392* (2013.01); *H01L 2224/0401* (2013.01); *H01L 2224/0557* (2013.01); *H01L 2224/13139* (2013.01); *H01L 2224/13147* (2013.01); *H01L 2224/13155* (2013.01); *H01L 2224/13157* (2013.01); *H01L 2224/16147* (2013.01); *H01L 2224/2919* (2013.01); *H01L 2224/32145* (2013.01); *H01L 2224/73204* (2013.01); *H01L 2224/811* (2013.01); *H01L 2224/81002* (2013.01); *H01L 2224/83121* (2013.01); *H01L 2224/83855* (2013.01); *H01L 2224/83862* (2013.01); *H01L 2224/83868* (2013.01); *H01L 2224/83871* (2013.01); *H01L 2224/83874* (2013.01); *H01L 2224/92* (2013.01); *H01L 2224/92143* (2013.01); *H01L 2224/94* (2013.01); *H01L 2224/96* (2013.01); *H01L 2224/97* (2013.01); *H01L 2225/06513* (2013.01)

(56) References Cited

U.S. PATENT DOCUMENTS

| | | | |
|---|---|---|---|
| 6,653,170 B1* | 11/2003 | Lin | H01L 21/563 257/E21.503 |
| 6,962,835 B2* | 11/2005 | Tong | B23K 20/02 257/E21.505 |
| 8,482,132 B2* | 7/2013 | Yang | H01L 24/03 257/777 |
| 8,492,265 B2* | 7/2013 | Yang | H01L 24/03 257/E21.584 |
| 8,802,541 B2* | 8/2014 | Wang | H01L 21/76251 257/618 |
| 2007/0262468 A1* | 11/2007 | Nasu | H01L 23/48 257/778 |
| 2008/0073795 A1* | 3/2008 | Kohl | H01L 24/10 257/774 |
| 2011/0084403 A1* | 4/2011 | Yang | H01L 24/03 257/777 |
| 2012/0190187 A1* | 7/2012 | Yang | H01L 24/03 438/618 |
| 2012/0199981 A1* | 8/2012 | Jeong | H01L 23/481 257/774 |
| 2013/0307165 A1* | 11/2013 | Wang | H01L 21/76251 257/782 |
| 2015/0311188 A1* | 10/2015 | Mao | H01L 25/50 438/15 |

\* cited by examiner

METHODS OF FABRICATION AND TESTING OF THREE-DIMENSIONAL STACKED INTEGRATED CIRCUIT SYSTEM-IN-PACKAGE

CROSS-REFERENCES TO RELATED APPLICATIONS

This application claims the priority of Chinese patent application number 201410168052.X, filed on Apr. 24, 2014, the entire contents of which are incorporated herein by reference.

TECHNICAL FIELD

The present invention provides methods of fabricating and testing a three-dimensional (3D) stacked integrated circuit (IC) system-in-package (SiP) and relates to the field of semiconductor system integration and packaging.

BACKGROUND

System-in-packages (SiPs) of various three-dimensional (3D) stacked architectures have found increasing use in the field of integrated circuit (IC) SiP testing. For example, a 3D SiP of the most typical type, i.e., an SiP containing two vertically stacked chips, can be formed by any of the following approaches:

1) three-dimensionally attaching the two vertically stacked dies onto a substrate with a curing adhesive, and connecting contacts of the two dies to the substrate with wire bonds;

2) three-dimensionally attaching the two vertically stacked dies onto a substrate with a curing adhesive, and using wire bonds to connect the contacts of the upper die to a bond pad of the lower die and the contacts of the lower die to the substrate;

3) flipping over the upper die, interconnecting the upper and lower dies by reflowing solder bumps that have been formed on surfaces of the upper and lower dies in advance, and connecting the contacts of the lower die to the substrate using wire bonds; and 4) flipping over the upper die, interconnecting the upper and lower dies by reflowing solder bumps that have been formed on surfaces of the upper and lower dies in advance, and connecting the contacts of the lower die to the substrate through preformed silicon vias (TSVs) extending between the contacts and a back side of the lower die.

In these approaches, the solder bump flip chip processes have been finding increasingly extensive use, particularly in the future high density SiPs based on TSVs and micro-solder-bump flip chip process. However, the application of the solder-bump flip chip process using densely arranged solder bumps in 3D stacking and interconnection still remains a great challenge and leads to high manufacturing costs. In particular, the void-free filling and reliable curing of a liquid medium within the gaps between the dies after the flipping and solder bump reflowing is a very challenging process to yield and cost issues.

SUMMARY OF THE INVENTION

The objective of the present invention is simplification of packaging process and improvement of device performance. To this end, the present invention proposes a novel method of fabricating a three-dimensional (3D) stacked integrated circuit (IC) system-in-package (SiP), essentially including the steps of:

providing a first semiconductor wafer 100 having a plurality of first dies 110 formed thereon, the plurality of first dies 110 have top surfaces located in a same plane as a top surface of the first semiconductor wafer 100, each of the plurality of first dies 110 having a first wire bond pad 190 formed in a peripheral part thereof and a first dielectric layer 120 over the top surface thereof, at least a portion of a surface of the first wire bond pad 190 not covered by the first dielectric layer and constituting an exposed area of the first die;

providing a plurality of second dies 210, each having a second wire bond pad 290 formed in a peripheral part thereof and a second dielectric layer 220 over a top surface thereof, at least a portion of a surface of the second wire bond pad 290 not covered by the second dielectric layer 220 and constituting an exposed area of the second die, the exposed area of the second die being different in size compared with the exposed area of the first die;

aligning each of the plurality of second dies 210 with a corresponding one of the plurality of first dies and bonding the second dielectric layer 220 of each of the plurality of second dies to the first dielectric layer 120 of a corresponding one of the plurality of first dies 110, such that a cavity 90 is formed in each pair of the bonded first and second dies, wherein the at least a portion of the surface of the second wire bond pad 290 and the at least a portion of the surface of the first wire bond pad 190 are exposed in the cavity and faces each other; and plating the first semiconductor wafer 100 bonded with the plurality of second dies 210 such that a plating structure 95 fills the cavity 90 of each pair of the bonded first and second dies, thereby forming plating electrical interconnects 195 vertically interconnecting the first and second wire bond pads in the cavity.

The present invention also provides a method of testing a three-dimensional (3D) stacked integrated circuit (IC) system-in-package (SiP), characterized in further including the steps of:

forming input/output bond pads on the top surface of the first semiconductor wafer corresponding to the cavities, each of the input/output bond pads connected to a corresponding plating electrical interconnect;

electrically disconnecting the first wire bond pads; and completing electronic testing of each system of integrated first die and second die by bringing microprobes into contact with the input/output bond pads in the plurality of first dies, wherein each of the plurality of first dies is connected to a corresponding plating electrical interconnect.

By bonding dielectric layers of a plurality of second dies sliced from a second semiconductor wafer to dielectric layers of a plurality of first dies on a first semiconductor wafer which serves as a carrier and interconnecting an exposed area of each second die and an exposed area of a corresponding first die by a plating process, the present invention enables the construction of 3D stacked systems of the first and second dies. In addition, the present invention also enables electronic testing of these stacked systems by bringing microprobes into contact with input/output bond pads overlying plating solder points formed on the first dies.

The fabrication and testing methods of the present invention allow wafer-level SiP fabrication, electrical interconnection and system testing and offers advantages such as process simplicity, high integration and low cost.

BRIEF DESCRIPTION OF THE DRAWINGS

The following drawings are included herein as part of the present invention for a better understanding of the invention.

The drawings illustrate embodiments of the present invention as well as their description, intended for explaining the principles of the invention.

DETAILED DESCRIPTION

For a better understanding of the present invention, detailed steps and structures are set forth in the following description for explaining the technical aspects of the invention. While some preferred embodiments of the present invention are described in detail below, it should be understood that the invention may have other embodiments in addition to those described below. As used herein, the terms "first" and "second" are terms to distinguish different elements and are not intended to be limiting of the invention.

In the field of integrated circuit (IC) System-in-package (SiP) testing, there is sometimes a need for integrating two chips of different functions or structures, i.e., forming a three-dimensional (3D) stacked SiP. This requires a package process involving bonding the two chips together and electrically interconnecting them by interconnecting their wire bonds. Commonly used four conventional SiP fabrication methods have been described in the Background section. In the following disclosure, SiP fabrication methods according to the present invention will be described.

Embodiment 1

Figure 1:
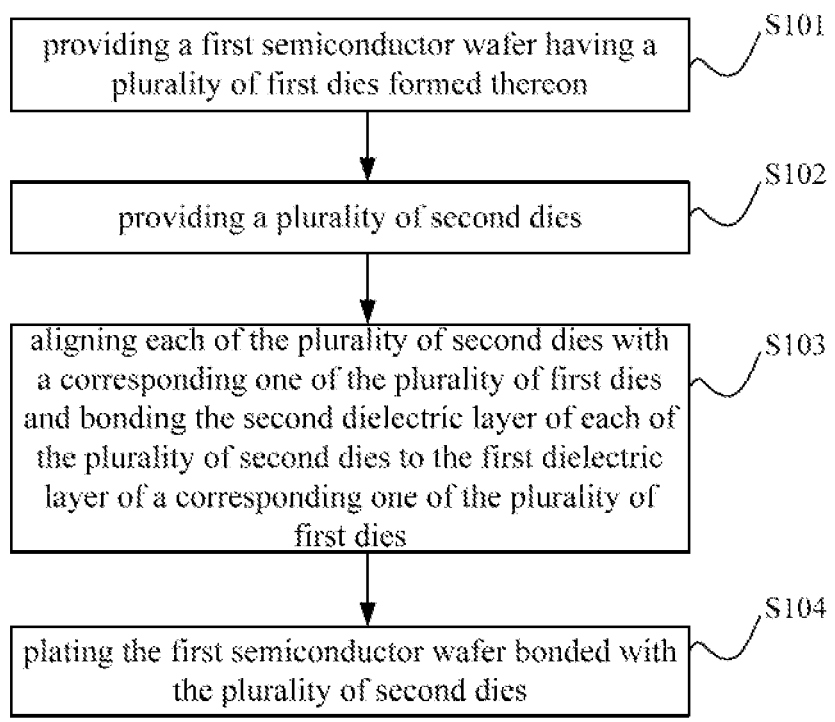
FIG. 1 is a flowchart graphically illustrating a method of fabricating a three-dimensional (3D) stacked integrated circuit (IC) system-in-package (SiP) in accordance with the present invention.

Referring to FIG. 1, in this embodiment, a method of fabricating a 3D stacked IC SiP includes the steps described in detail below.

Figure 2:
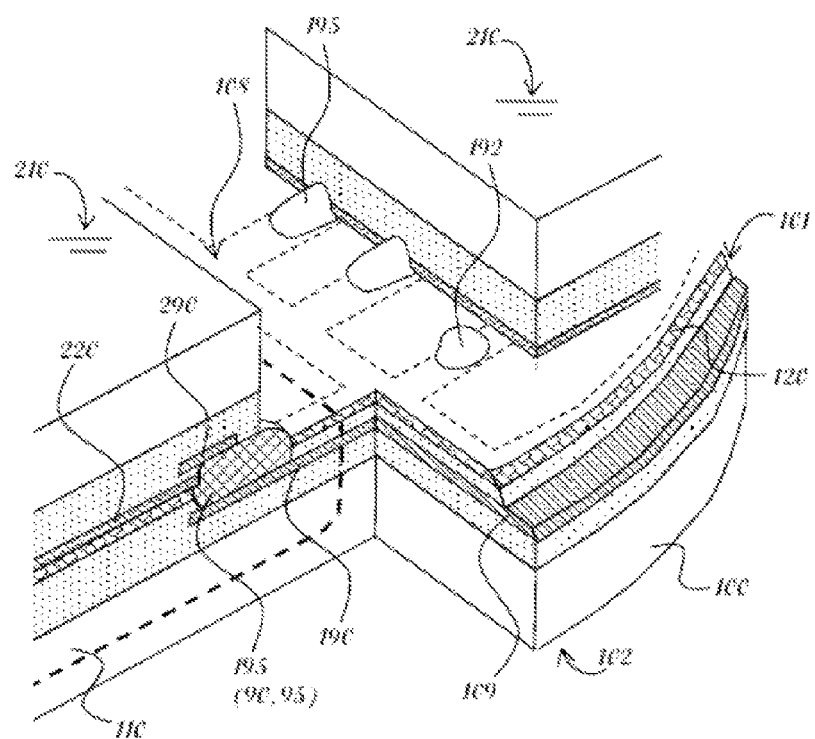
FIG. 2 is a schematic cutaway view of a typical structure formed in a method of fabricating a 3D stacked IC SiP in accordance with the present invention.
Figure 3:
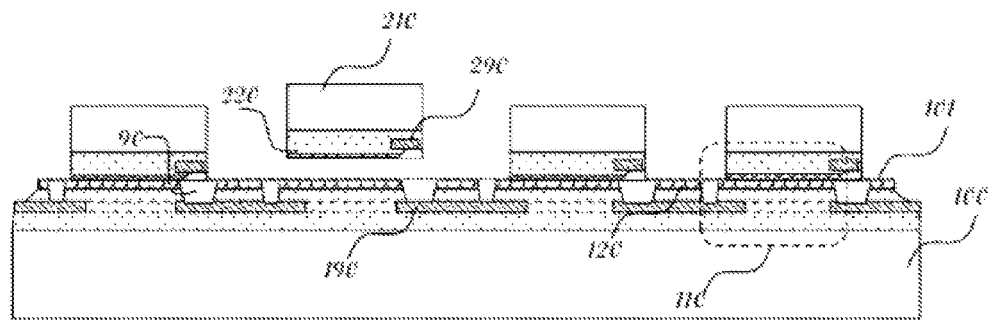
FIGS. 3 to 7 are schematics showing a method of fabricating a 3D stacked IC SiP in accordance with a first embodiment of the present invention.

In step S101, as shown in FIGS. 2 and 3, a first semiconductor wafer 100 is provided, on which a plurality of first dies 110 are formed. The top surfaces of the plurality of first dies 110 are located in the same plane as a top surface of the first semiconductor wafer 100. Each first die 110 is provided with a first wire bond pad 190 formed in a peripheral part of the specific first die with at least a portion of the surface of the first wire bond pad 190 exposed in the air. A first dielectric layer 120 is formed over each first die 110 and covers the rest part of the surface of the specific first die 110 other than the exposed portion of the surface of the first wire bond pad 190. Specifically, in this embodiment, the first semiconductor wafer 100 is implemented as a silicon semiconductor substrate, and the first dielectric layer 120 is a curing insulating adhesive. In other embodiments, the first dielectric layer 120 may also be silicon oxide, silicon nitride or other dielectric materials. As used herein, a "die" refers to a pre-packaging form of a chip, which includes a device layer and wire bonds. The wire bonds are coupled to a wire bond pad located at a portion reserved for accommodating I/O pins during packaging. Generally, the wire bond pad is located at a peripheral part of the die and is exposed in order to accommodate the I/O pins. The rest part of the die is protected by a dielectric layer from the occurrence of short circuits. The exposure of the wire bond pad may be accomplished by etching away the dielectric material over it. As a result, the surface of the wire bond pad is lower than the surface of the dielectric layer. That is, a recess is formed in an area in correspondence with the exposed portion of the wire bond pad. In this embodiment, the recess over the wire bond pad may be formed either by using a conventional die fabrication process or by changing the thickness and material of the dielectric layer. The recess may be, for example, a square bore.

In step S102, as shown in FIGS. 2 and 3, a plurality of second dies 210 are provided. Each second die 210 is provided with a second wire bond pad 290 formed in a peripheral part of the specific second die with at least a portion of the surface of the second wire bond pad 290 exposed in the air. A second dielectric layer 220 is formed over each second die 210 and covers the rest part of the surface of the specific second die 210 other than the exposed portion of the surface of the second wire bond pad 290. The exposed area of the second die is sized differently from the exposed area of the first die. In this embodiment, each second die may have a surface profile similar to a surface profile of each first die, i.e., lower in the wire bond pad portion than in the dielectric layer portion, thus forming a recess. However, as the first dies are to be bonded to the second dies in a subsequent process according to the present application, in order to make sure that each pair of first and second wire bond pads is not completely enclosed within a cavity delimited by the corresponding recesses, it is required, according to the present application, that an exposed area of each second die not covered by the second dielectric layer (i.e., an area of the exposed portion of the surface of the second wire bond pad 290 of each second die) differs from an exposed area of each first die not covered by the first dielectric layer (i.e., an area of the exposed portion of the surface of the first wire bond pad 190 of each first die), such that a cavity delimited by the recesses in correspondence with each pair of first and second wire bond pads is not completely closed and has an opening in communication with the air.

In this embodiment, the second dielectric layer 220 is a curing insulating adhesive. In other embodiments, the second dielectric layer 220 may also be silicon oxide. In this embodiment, each second die 210 is implemented as a silicon semiconductor substrate. In other embodiments, each second die 210 may also be implemented as a Group compound semiconductor substrate or a Group II-VI compound semiconductor substrate.

In step S103, as shown in FIGS. 2 and 3, each second die 210 is aligned with a corresponding one of the first dies 110, and the second dielectric layer 220 on the surface of the specific second die 210 is bonded to the first dielectric layer 120 on the surface of the specific one of the first dies 110, such that the exposed portion of the surface of the second wire bond pad 290 of the specific second die 210 vertically faces the exposed portion of the surface of the first wire bond pad 190 of the specific one of the first dies 110 to delimit a hollow cavity 90 in which the exposed portions of the first wire bond pad 190 and the second wire bond pad 290 are situated. As the formation of the cavity 90 has been described above in conjunction with the description of step S102, further description of it is omitted herein.

In this embodiment, the second dies 210 are individually bonded to corresponding ones of the first dies 110 on the first semiconductor wafer 100. That is, the individual second dies 210 are bonded one by one to the first semiconductor wafer 100.

In this embodiment, the bonding was accomplished by using a curing insulating adhesive, specifically, by liquid film coating combined with heat or radiation curing. In addition, other bonding methods known by those skilled in the art may also be used.

Figure 4:
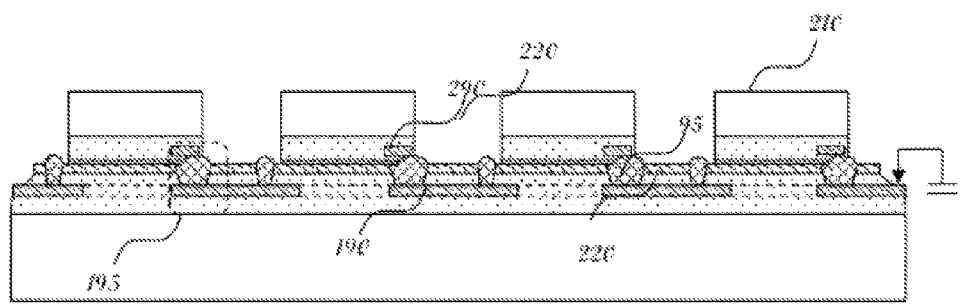

In step S104, as shown in FIGS. 2 and 4, the first semiconductor wafer 100 bonded with the second dies 210 is plated such that a plating structure 95 extends vertically from an edge of each second die 210 and fills the corresponding cavity 90, thereby forming a plating electrical interconnect 195 that vertically interconnects the corresponding pair of first wire bond pad 190 and second wire bond pad 290. In this embodiment, the plating is an electroless plating process, i.e., a chemical plating process. Specifically, the structure resulting from the bonding may be placed in a solution such as, for example, a solution for electroless plating of silver, nickel, copper, cobalt, a nickel-phosphorus alloy, or a nickel-boron alloy. Based on the principle of oxidation reduction reaction rather than relying on electrical power, a potent reductive agent in the solution may gradually reduce the metal ions in the solution into the corresponding metal or alloy which is then deposited on the exposed surfaces of the first wire bond pads 190. With the gradual deposition of metal or alloy on the bond pads, dense plating metallic layers are finally formed and fill the cavities 90, thus achieving interconnection and packaging of the first and second dies.

In this embodiment, after the bonding, a dielectric material 225 is preferably filled in gaps between adjacent second dies 210 such that the dielectric material covers the plating electrical interconnects 195. Specifically, the dielectric material 225 may be silicon oxide, silicon nitride or another dielectric material, provided for the insulation and protection of the plating electrical interconnects.

In this embodiment, after the completion of the plating and the formation of the electrical interconnects between the vertically aligned first wire bond pads 190 and second wire bond pads 290, the method preferably further includes the following step 1041.

Figure 5:
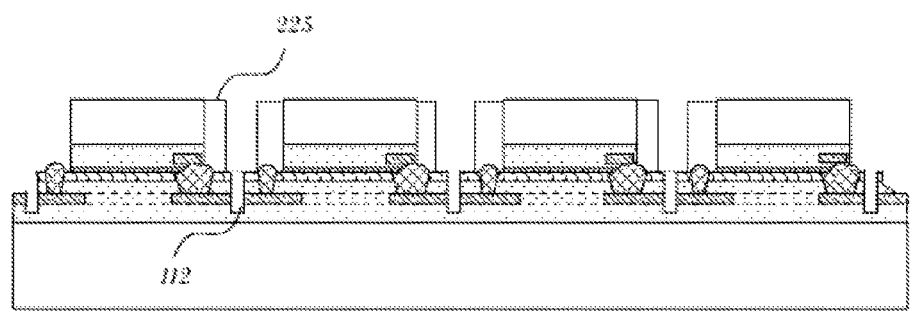
Figure 7:
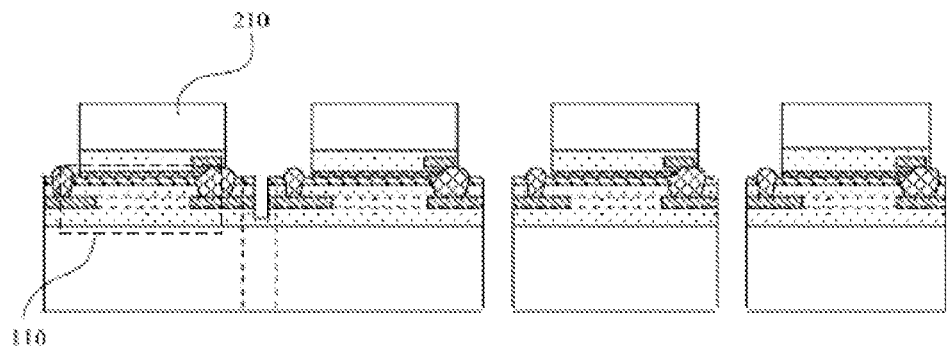

Referring to FIGS. 2, 5 and 7, in step 1041, materials between each two adjacent first dies, as well as materials between each two adjacent second dies, are removed such that separate independent stacks each consisting of bonded second die 210 and first die 110 are obtained. Specifically, this may be accomplished by etching away the dielectric material, such as the gap filling dielectric material, between adjacent second dies 210 to separate apart the second dies and then etching the first semiconductor wafer 100 to form grooves 112 each between adjacent first dies 110. Afterwards, one may continue etching in the grooves 112 until the first dies 110 are separated from one another, or alternatively grinding a bottom surface (back side) of the first semiconductor wafer 100 to separate apart the first dies 110.

In general terms, a semiconductor chip is formed by epitaxially growing a semiconductor material over a surface of a semiconductor wafer, and this surface of the wafer is called a front side (top surface) and the opposite surface is called a back side (bottom surface).

Embodiment 2

Figure 8:
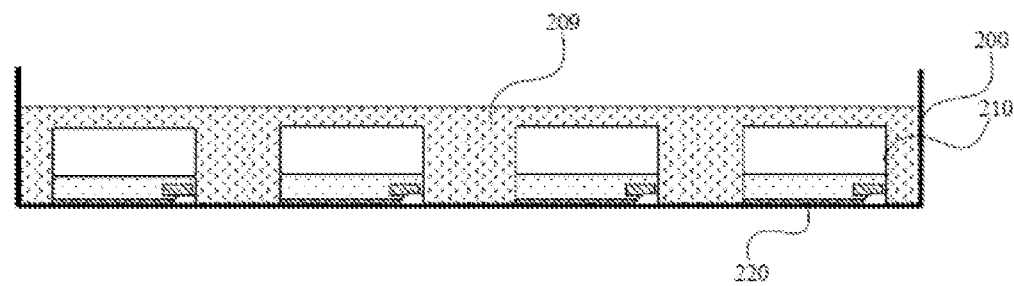
FIGS. 8 to 11 are schematics showing a method of fabricating a 3D stacked IC SiP in accordance with a second embodiment of the present invention.
Figure 9:
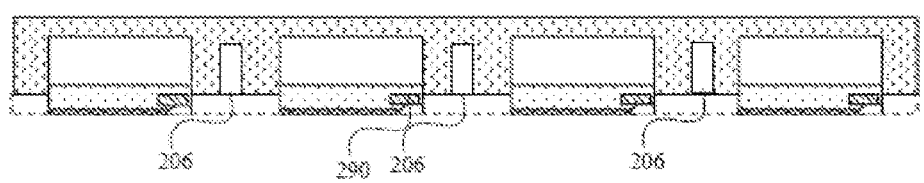
Figure 10:
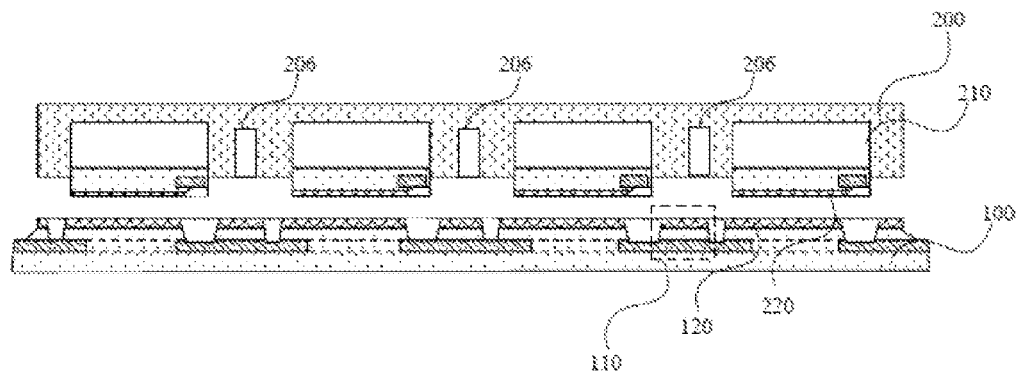
Figure 11:
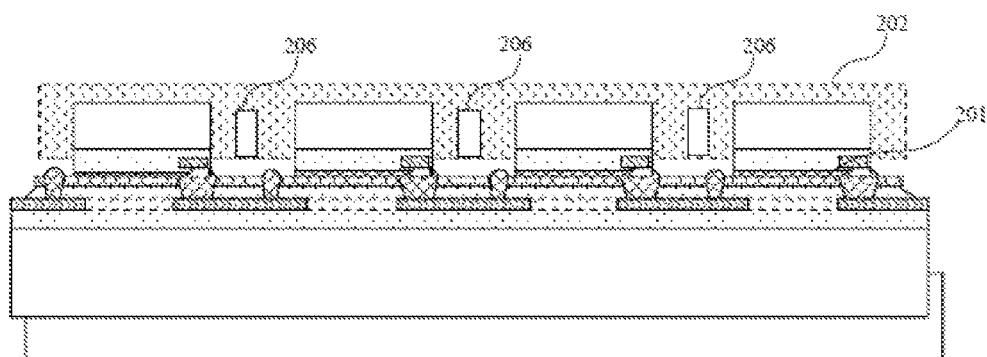

A method according to this embodiment has some steps that are the same as those of the method of Embodiment 1 and are thus not further described herein, except that step S103 of the method of this embodiment includes:

step S1031: arranging the individual second dies 210 at positions corresponding to the respective first dies 110, with the second dielectric layers 220 of the second dies 210 all located in the same plane, and injection molding a second wafer 200 by filling an injection molding material 209 among the second dies, as shown in FIGS. 2 and 8, and exposing portions of the second wire bond pads 290 by etching away the injection molding material 209 thereon, as shown in FIG. 9;

step S1032: vertically aligning the second wafer 200 with the first semiconductor wafer 100 such that each second die 210 on the second wafer 200 faces a corresponding one of the first dies 110 on the first semiconductor wafer 100, and bonding the second dielectric layer 220 on each second die 210 to the first dielectric layer 120 on a corresponding one of the first dies 110 such that the second wafer 200 and the first semiconductor wafer 100, as well as each second die 210 and a corresponding one of the first dies 110, are aligned with and bonded to each other, as shown in FIGS. 2, 10 and 11; and step S1033: removing part or the entire of the injection molding material 209. The removal of the injection molding material 209 may be accomplished by ashing, dry etching or wet etching. The second wafer 200 may then be grinded from a back side 202 opposing the side 201 where the bonding occurs.

In this embodiment, the first semiconductor wafer 100 may have the same size as the second wafer 200, and the number of the first dies on the first semiconductor wafer may be equal to the number of the second dies on the second wafer. In addition, the bonding between the second dielectric layers 220 on the second dies 210 and the first dielectric layers 120 on the first dies 110 may be accomplished by optically aligned wafer-level bonding between the first semiconductor wafer 100 and the second wafer 200.

In this embodiment, after grooves 206 have been etched in the surface of the second wafer 200 and the optically aligned wafer-level bonding between the first semiconductor wafer 100 and the second wafer 200 has been done, the second wafer 200 may be grinded from its back side until the grooves 206 and the underlying surface of the first semiconductor wafer 100 are exposed, such that the second dies 210 are separated apart.

Further, grooves for separating the first dies may be pre-etched in the top surface of the first semiconductor wafer.

Embodiment 3

A method according to this embodiment has some steps that are the same as those of the methods of the previous embodiments and are thus not further described herein, but there are some differences as described below.

In this embodiment, referring to FIG. 2, all the first wire bond pads 190 in the first dies 110 are electrically connected. Specifically, in this embodiment, an interconnection in the form of a conductive grid 109 including a conductive lead frame 108 is formed on the top surface of the first semiconductor wafer 100 and electrically connected with all the first wire bond pads 190 in the first dies 110, with the conductive lead frame 108 covering the periphery of the first semiconductor wafer.

In a chip fabrication process, a metal layer may be first deposited and etched to form desired interconnecting metal wires. Part of a dielectric layer formed over the surfaces of the dies may then be etched away to expose input/output terminals of the interconnecting metal wires to serve as wire bond pads. In this embodiment, as a plating metallic layer will be subsequently formed on each wire bond pad by an electroplating process, in the metal wire formation step, all the metal wires formed in the first dies may be interconnected via metal wires external to the dies, including those distributed along the periphery of the first semiconductor wafer. As such, all the metal wire bonds formed in the first dies form the conductive grid, and the portions of interconnected metal wires external to the first dies form the conductive lead frame 108.

In this embodiment, the plating in step S104 is an electroplating process using two electrodes one of which is maintained in electrical connection with the first wire bond pads, for example by connecting to the conductive lead frame 108. In this embodiment, the specific electrode is connected to the interconnecting metal wires along the entire periphery of the first semiconductor wafer. As a result, during the electroplating process, a metal is gradually deposited on the surfaces of the first wire bond pads and ultimately fills the respective cavities in which the first wire bond pads are exposed, thus achieving the interconnection between the first wire bond pads and the second wire bond pads.

In this embodiment, each plating structure 95 formed in the electroplating process is a metal selected from the group consisting of copper, nickel, zinc, tin, silver, gold, tungsten and magnesium, or an alloy of any two of the above metals. This is hardly achievable by conventional vapor deposition processes which are generally only capable of forming structure of a single metal or a stacked structure.

Figure 12:
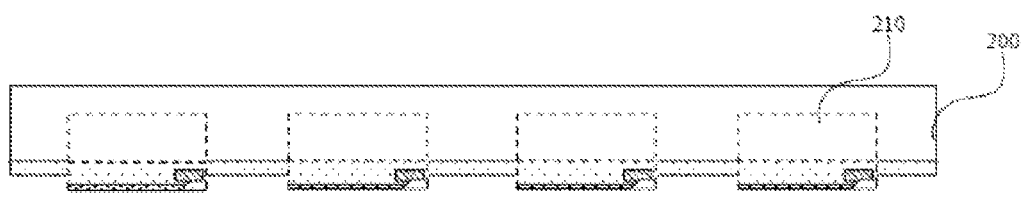
FIGS. 12 to 15 are schematics showing a method of fabricating a 3D stacked IC SiP in accordance with a third embodiment of the present invention.
Figure 13:
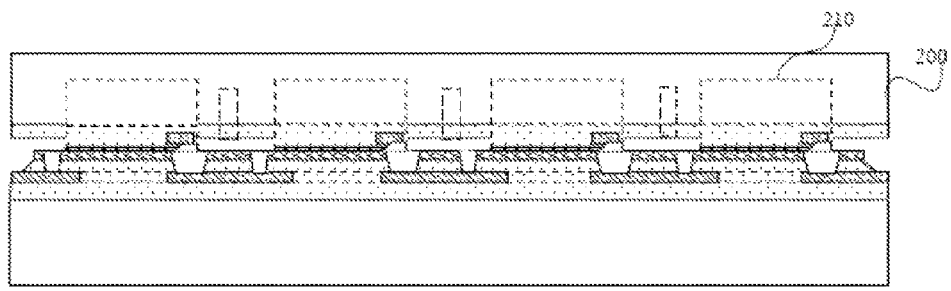
Figure 14:
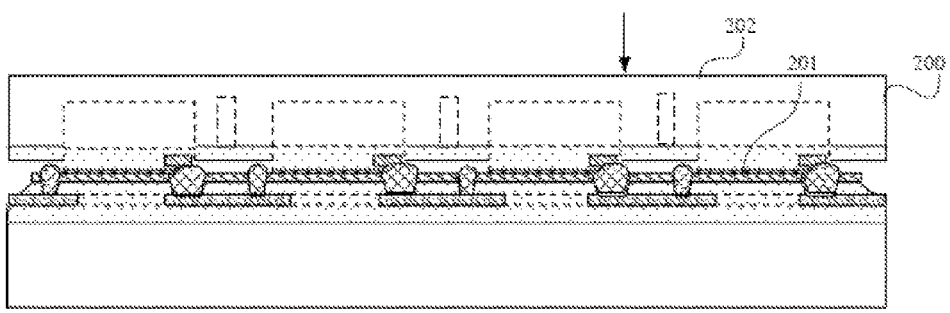
Figure 15:
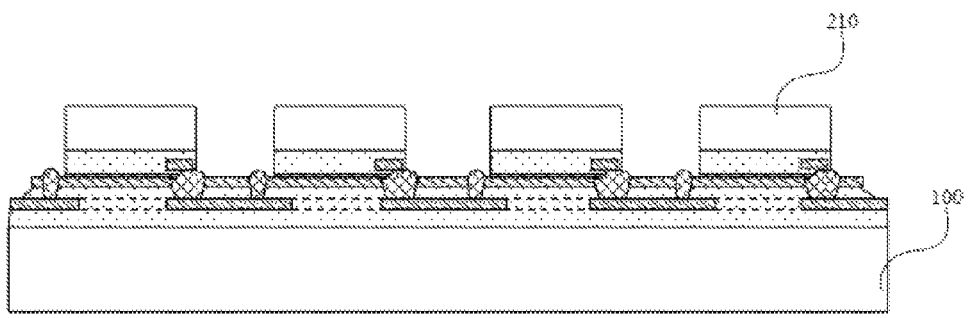

In this embodiment, as shown in FIGS. 12 to 13, preferably, the second dies 210 are provided on a second semiconductor wafer 200. That is, the second dies 210 are dies formed by a semiconductor process all integrally on the second semiconductor wafer 200 prior to slicing. This is advantageous in eliminating the need for a separate step to slice apart the second dies 210 and in achieving more accurate optically aligned wafer-level bonding Referring to FIGS. 14 to 15, in this embodiment, the second semiconductor wafer 200 is preferably grinded from a back side 202 opposing the side 201 where the bonding occurs.

The first semiconductor wafer 100 may have the same size as the second semiconductor wafer 200, and the number of the first dies on the first semiconductor wafer may be equal to the number of the second dies on the second semiconductor wafer. In addition, the bonding between the second dielectric layers 220 on the second dies 210 and the first dielectric layers 120 on the first dies 110 may be accomplished by optically aligned wafer-level bonding between the first semiconductor wafer 100 and the second semiconductor wafer.

In this embodiment, a groove 206 is preferably etched along the periphery of each second die 210 on the second semiconductor wafer prior to the wafer-level bonding. With the completion of the optically aligned wafer-level bonding of the first semiconductor wafer 100 and the second semiconductor wafer 200, the second semiconductor wafer 200 may be grinded from its back side until the grooves 206 and the underlying surface of the first semiconductor wafer 100 are exposed, such that the second dies 210 are separated apart.

In this embodiment, a step 1041 is further included, for removing materials between the first dies and between the second dies, in order to obtain individual stacks each consisting of bonded second die 210 and first die 110. Additionally, as all of the first wire bond pads 190 are interconnected in this embodiment, it is further needed to electrically disconnect the first wire bond pads 190 to make them independent from one another. The disconnection among the first wire bond pads 190 may be accomplished, for example, by cutting the periphery of the wafer such that the conductive lead frame is cut off.

Embodiment 4

A method according to this embodiment has some steps that are the same as those of the methods of the previous embodiments and are thus not further described herein, but there are some differences as described below.

Figure 16:
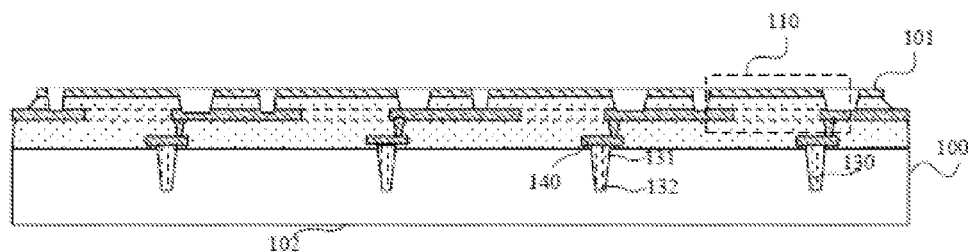
FIGS. 16 to 18 are schematics showing a method of fabricating a 3D stacked IC SiP in accordance with a fourth embodiment of the present invention.

In this embodiment, as shown in FIG. 16, in step 101, each first die 110 on the first semiconductor wafer 100 has a conductive via interconnect 130 perpendicular to the top surface 101 of the first semiconductor wafer. The conductive via interconnect 130 has a first end 131 connected to a horizontal interconnect layer 140 of the specific first die 110 and a second end 132 extending toward a bottom surface 102 of the first semiconductor wafer.

Figure 17:
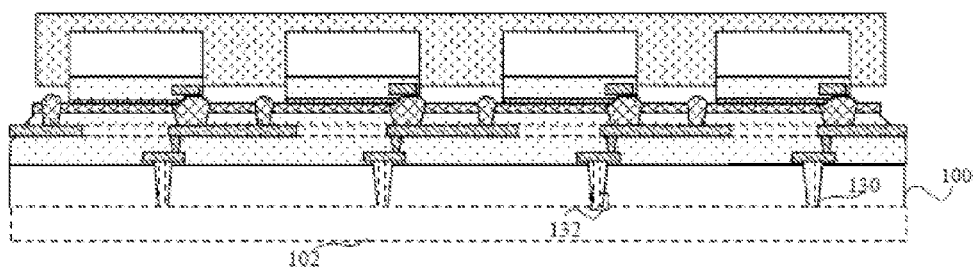

Step 104 includes a step 1041 of grinding the first semiconductor wafer 100 from the bottom surface 102 thereof to expose the second end 132 of each conductive via interconnect 130, as shown in FIG. 17.

Figure 18:
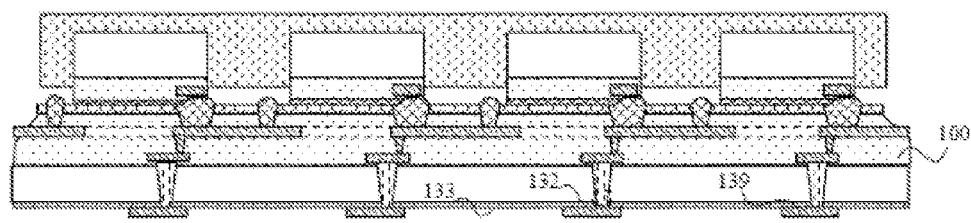

Referring to FIG. 18, step 104 further includes a step 1042 of depositing a capping dielectric layer 133 over the grinded bottom surface 102 of the first semiconductor wafer 100 and forming backside wire bond pads 139 on the capping dielectric layer 133, each connected with the second end 132 of a corresponding conductive via interconnect 130.

Embodiment 5

A method according to this embodiment has some steps that are the same as those of the methods of the previous embodiments and are thus not further described herein, but there are some differences as described below.

Figure 19:
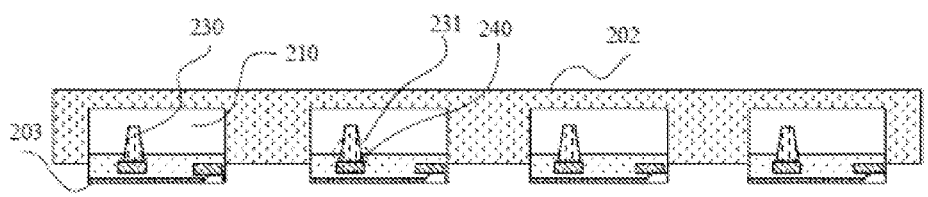
FIGS. 19 to 23 are schematics showing a method of fabricating a 3D stacked IC SiP in accordance with a fifth embodiment of the present invention.
Figure 20:
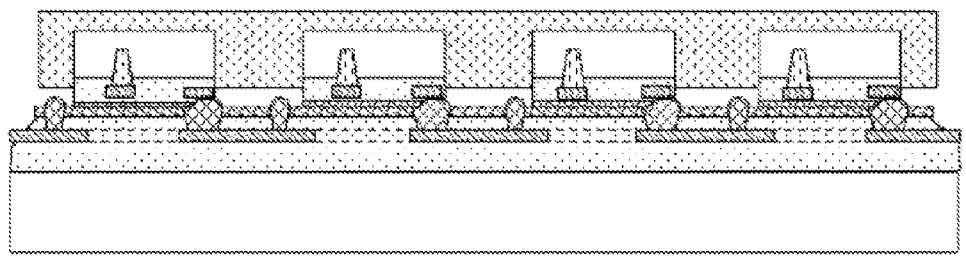

In this embodiment, referring to FIGS. 19 and 20, in step 101, each second die 210 on the second semiconductor wafer has a conductive via interconnect 230 perpendicular to the top surface 203 of the second semiconductor wafer. The conductive via interconnect 230 has a first end 231 connected to a horizontal interconnect layer 240 of the specific second die 210 and a second end 232 extending toward a bottom surface 202 of the second semiconductor wafer.

Figure 21:
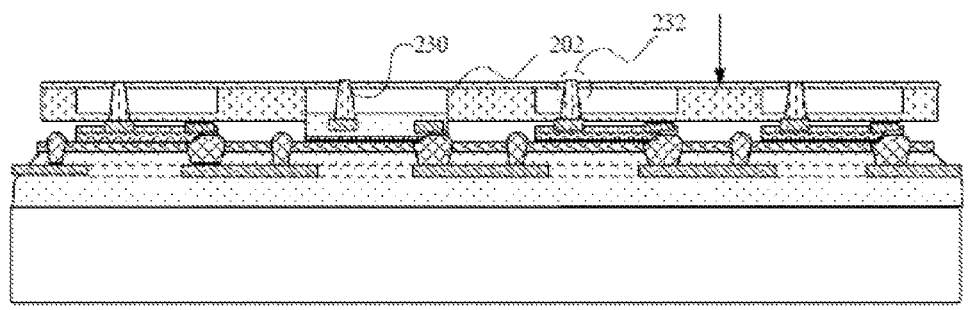

Step 104 includes a step 1041 of grinding the second semiconductor wafer 200 from the bottom surface (back side) 202 thereof to expose the second end 232 of each conductive via interconnect 230, as shown in FIG. 21.

Figure 22:
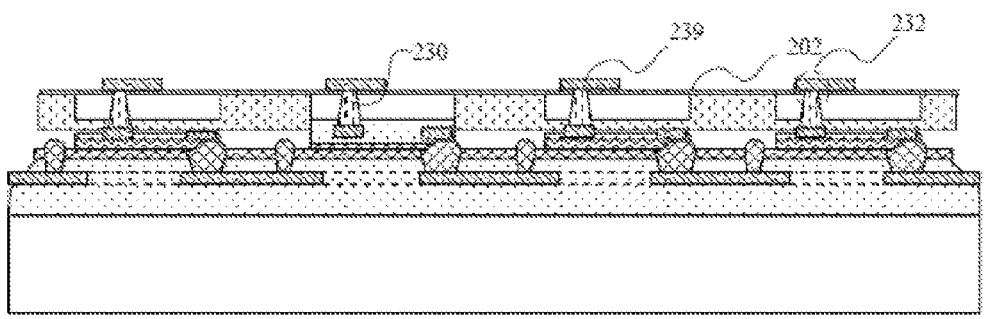

Referring to FIG. 22, backside wire bond pads 239, each connected to the second end 232 of a corresponding conductive via interconnect 230, may be then formed on the back side 202 of the second semiconductor wafer 200.

In the above described embodiments, removing the materials between dies may be accomplished by one selected from the group consisting of mechanical cutting and laser cutting, or a combination of the above.

In addition, removing the materials between dies may include causing crack propagation with mechanical forces along vertical grooves pre-etched in the first semiconductor wafer 100 or the second semiconductor wafer 200.

Figure 23:
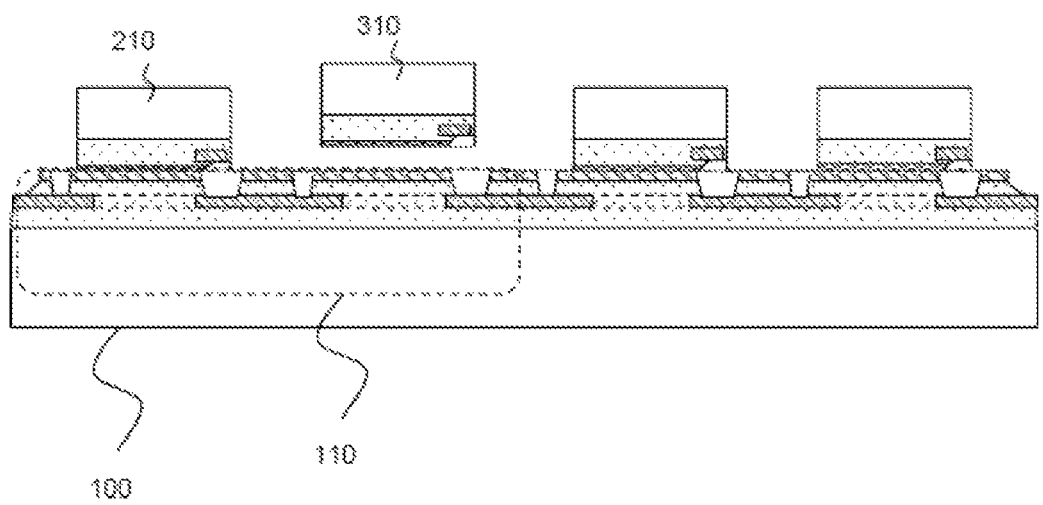

Referring to FIG. 23, third dies may be additionally stacked in the same manner as described above, for example, the third dies 310 are stacked onto the first semiconductor wafer 100 together with the second dies 210. The first dies 110 may then be integrated and interconnected to the second dies 210 and third dies 310 by performing a plating process to form plating structures vertically extending from edges of the second dies 210 and third dies 310 and filling the cavities corresponding thereto and forming input/output wire bond pads on portions of the top surface of the first semiconductor wafer corresponding to the cavities. It is to be noted, in this case, the second dies 210 and third dies 310 may be of different sizes or even different types. Similarly, the methods according to the present invention described herein can enable the stacking, interconnection and integration of the first dies 110 to other dies of one or more different types.

Figure 6:
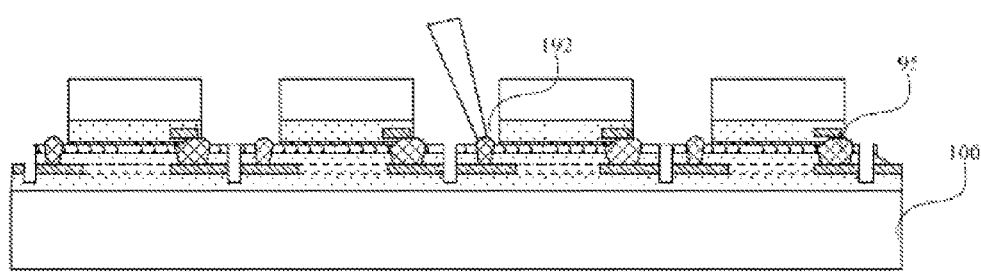

The present invention further provides a method of testing the 3D stacked IC SiP. Referring to FIG. 6, in addition to those of one of the fabrication methods as described above, the testing method further includes the steps of:

after the plating structures 95 that vertically extend from edges of the second dies 210 and fill the respective cavities are formed, forming input/output bond pads 192 on portions of the top surface of the first semiconductor wafer 100 outside the cavities, each of the input/output bond pad 192 covering at least a portion of and being connected to a corresponding plating electrical interconnect;

electrically disconnecting the first wire bond pads 190; and completing electronic testing of each system of integrated first die 110 and second die 210 by bringing microprobes into contact with input/output bond pads 192 on the first dies 110 that are connected to the corresponding plating electrical interconnects.

Alternatively, the input/output bond pad 192 electrically interconnected to the plating structure 95 may also be formed by a plating process on other portions of the first semiconductor wafer.

While the invention has been described with reference to the foregoing embodiments, it should be understood that these disclosed embodiments are exemplary and illustrative, not intended to limit the invention to only the scope of the disclosed embodiments. In addition, it will be understood by those skilled in the art that the present invention is not limited to the disclosed embodiments and various changes and modifications can be made therein in light of the above teachings. Therefore, it is intended that all such changes and modifications fall within the scope of the invention as defined by the appended claims and their equivalents.

What is claimed is:

1. A method of fabricating a three-dimensional (3D) stacked integrated circuit (IC) system-in-package (SiP), comprising:
    step 1: providing a first semiconductor wafer having a plurality of first dies formed thereon, the plurality of first dies having top surfaces located in a same plane as a top surface of the first semiconductor wafer, each of the plurality of first dies having a first wire bond pad formed in a peripheral part thereof and a first dielectric layer over the top surface of each of the plurality of first dies, wherein at least a portion of a surface of the first wire bond pad is not covered by the corresponding first dielectric layer and constitutes an exposed area of the corresponding first die, the exposed area of each of the plurality of first dies having a first length in a first direction from a first end of the exposed area that is closer to a center of the corresponding first die to a second end of the exposed area that is farther from the center of the corresponding first die, the first direction being parallel with the top surface of the first semiconductor wafer;
    step 2: providing a plurality of second dies, each having a second wire bond pad formed in a peripheral part thereof and a second dielectric layer over a top surface of each of the plurality of second dies, wherein at least a portion of a surface of the second wire bond pad is not covered by the corresponding second dielectric layer and constitutes an exposed area of the corresponding second die, the exposed area of each of the plurality of second dies having a second length in a second direction from a first end of the exposed area that is closer to a center of the corresponding second die to a second end of the exposed area that is farther from the center of the corresponding second die, the second direction being parallel with the top surface of the corresponding second die, the second length being different in magnitude compared with the first length;
    step 3: aligning each of the plurality of second dies with a corresponding one of the plurality of first dies such that the second direction is substantially parallel with the first direction and the first end of the exposed area of each of the plurality of second dies is substantially aligned with the first end of the exposed area of a corresponding one of the first dies and bonding the second dielectric layer of each of the plurality of second dies to the first dielectric layer of a corresponding one of the plurality of first dies, such that the second dielectric layer of each of the plurality of second dies is in direct contact with the first dielectric layer of a corresponding one of the plurality of first dies and an unclosed cavity is formed in each pair of the bonded first and second dies, wherein the at least a portion of the surface of the second wire bond pad and the at least a portion of the surface of the first wire bond pad are exposed in the unclosed cavity and faces each other; and
    step 4: plating the first semiconductor wafer bonded with the plurality of second dies such that a plating structure fills the cavity of each pair of the bonded first and second dies, thereby forming plating electrical interconnects vertically interconnecting the first and second wire bond pads in the cavity.

2. The method of fabricating a 3D stacked IC SiP according to claim 1, wherein in step 3, the plurality of second dies are individually bonded to the plurality of first dies on the first semiconductor wafer.

3. The method of fabricating a 3D stacked IC SiP according to claim 1, wherein step 3 further includes:
    arranging the plurality of second dies at positions corresponding to the plurality of first dies with the second dielectric layers of the plurality of second dies all located in a same plane, and injection molding a second wafer by filling an injection molding material between the plurality of second dies;
    vertically aligning the second wafer with the first semiconductor wafer such that the plurality of second dies on the second wafer face the plurality of first dies on the first semiconductor wafer, and bonding the second dielectric layer of each of the plurality of second dies to the first dielectric layer of a corresponding one of the plurality of first dies, such that the second wafer and the first semiconductor wafer, as well as the plurality of second dies and the plurality of the first dies, are aligned with and bonded to each other; and removing part or entire of the injection molding material.

4. The method of fabricating a 3D stacked IC SiP according to claim 3, further comprising grinding the second wafer from a back side opposing a side where the bonding occurs after the plurality of first and second dies are bonded.

5. The method of fabricating a 3D stacked IC SiP according to claim 3, wherein removing the injection molding material is accomplished by ashing, dry etching or wet etching.

6. The method of fabricating a 3D stacked IC SiP according to claim 1, wherein in step 3, the plurality of second dies are provided on a second semiconductor wafer.

7. The method of fabricating a 3D stacked IC SiP according to claim 6, wherein the first semiconductor wafer has a same size as the second wafer, wherein a number of the plurality of first dies on the first semiconductor wafer equals to a number of the plurality of second dies on the second wafer, and wherein bonding the second dielectric layer of each of the plurality of second dies and the first dielectric layer of a corresponding one of the plurality of first dies is accomplished by optically aligned wafer-level bonding of the first semiconductor wafer and the second wafer.

8. The method of fabricating a 3D stacked IC SiP according to claim 7, wherein prior to the wafer-level bonding, a groove along a circumference of each of the plurality of first dies are etched in the top surface of the first semiconductor wafer.

9. The method of fabricating a 3D stacked IC SiP according to claim 7, wherein after grooves are etched in the surface of the second wafer and the optically aligned wafer-level bonding of the first semiconductor wafer and the second wafer is done, the second wafer is grinded from a back side thereof until the grooves and the underlying top surface of the first semiconductor wafer are exposed, such that the plurality of second dies are separated apart.

10. The method of fabricating a 3D stacked IC SiP according to claim 1, wherein in step 1, all the first wire bond pads of the plurality of first dies are electrically interconnected, and wherein the plating in step 4 is an electroplating process using two electrodes and one of the two electrodes is maintained in electrical connection with the first wire bond pads.

11. The method of fabricating a 3D stacked IC SiP according to claim 10, wherein an interconnecting wire grid including a conductive lead frame is formed on the top surface of the first semiconductor wafer and electrically connected with all the first wire bond pads in the plurality of first dies, the conductive lead frame covering a peripheral part of the first semiconductor wafer; and wherein the plating in step 4 is an electroplating process using two electrodes and one of the two electrodes is maintained in electrical connection with the conductive lead frame.

12. The method of fabricating a 3D stacked IC SiP according to claim 10, further comprising the following step after forming plating electrical interconnects vertically interconnecting the first and second wire bond pads in the cavity:

removing materials between the plurality of first dies and materials between the plurality of second dies to obtain individual stacks each consisting of bonded second die and first die, and electrically disconnecting the first wire bond pads to make the first wire bond pads independent from one another.

13. The method of fabricating a 3D stacked IC SiP according to claim 10, wherein each plating structure formed in the electroplating process is a metal selected from the group consisting of copper, nickel, zinc, tin, silver, gold, tungsten and magnesium, or an alloy of any two of the above metals.

14. The method of fabricating a 3D stacked IC SiP according to claim 1, wherein the plating in step 4 is an electroless plating process.

15. The method of fabricating a 3D stacked IC SiP according to claim 1, wherein step 4 further comprises: after the bonding, filling a dielectric material in gaps between adjacent ones of the plurality of second dies such that the dielectric material covers the plating electrical interconnects.

16. The method of fabricating a 3D stacked IC SiP according to claim 3, wherein in step 1, each of the plurality of first die on the first semiconductor wafer has a conductive via interconnect perpendicular to the top surface of the first semiconductor wafer, the conductive via interconnect having a first end connected to an interconnect layer of the corresponding first die and a second end extending toward a bottom surface of the first semiconductor wafer.

17. The method of fabricating a 3D stacked IC SiP according to claim 16, wherein step 4 further comprises:

grinding the first semiconductor wafer from the bottom surface thereof to expose the second end of each conductive via interconnect.

18. The method of fabricating a 3D stacked IC SiP according to claim 17, wherein step 4 further comprises:

depositing a capping dielectric layer over the grinded bottom surface of the first semiconductor wafer and forming backside wire bond pads on the capping dielectric layer, each connected with the second end of a corresponding conductive via interconnect.

19. The method of fabricating a 3D stacked IC SiP according to claim 12, wherein removing materials between the plurality of first dies and materials between the plurality of second dies is accomplished by one selected from the group consisting of mechanical cutting and laser cutting, or a combination thereof.

20. The method of fabricating a 3D stacked IC SiP according to claim 12, wherein removing materials between the plurality of first dies and materials between the plurality of second dies comprises causing crack propagation with mechanical forces along vertical grooves pre-etched in the first semiconductor wafer and second wafer.

21. The method of fabricating a 3D stacked IC SiP according to claim 1, wherein the first semiconductor wafer is implemented as a silicon semiconductor substrate.

22. The method of fabricating a 3D stacked IC SiP according to claim 1, wherein the plurality of second dies are implemented as silicon semiconductor substrates.

23. The method of fabricating a 3D stacked IC SiP according to claim 1, wherein the plurality of second dies are implemented as Group III-V compound substrates.

24. The method of fabricating a 3D stacked IC SiP according to claim 1, wherein the first dielectric layers or the second dielectric layers are silicon oxide layers or a curing insulating adhesive.

25. The method of fabricating a 3D stacked IC SiP according to claim 24, wherein the first dielectric layers or the second dielectric layers are a curing insulating adhesive, and the bonding of the plurality of first and second dies is accomplished by liquid film coating combined with heat or radiation curing.

26. The method of fabricating a 3D stacked IC SiP according to claim 3, wherein each of the plurality of second dies has a conductive via interconnect perpendicular to the top surface thereof, the conductive via interconnect having a first end connected to an interconnect layer of the corresponding second die and a second end extending toward a bottom surface of the corresponding second die.

27. The method of fabricating a 3D stacked IC SiP according to claim 26, wherein step 4 further comprises:
grinding the second wafer from the bottom surface thereof to expose the second end of each conductive via interconnect.

28. The method of fabricating a semiconductor device according to claim 1, further comprising:
providing a plurality of third dies different from the plurality of first and second dies, each of the plurality of third dies having a third wire bond pad formed in a peripheral part thereof and a third dielectric layer over a top surface thereof, wherein at least a portion of a surface of the third wire bond pad is not covered by the third dielectric layer and constitutes an exposed area of the third die and the exposed area of the third die is different in size compared with the exposed area of the first die; and
performing the bonding and plating of the plurality of third dies and first dies in step 3 and step 4, respectively.

29. A method of testing a three-dimensional (3D) stacked integrated circuit (IC) system-in-package (SiP) comprising a method according to claim 1, further comprising the steps of:
forming input/output bond pads on the top surface of the first semiconductor wafer outside the cavities, each of the input/output bond pads connected to a corresponding plating electrical interconnect;
electrically disconnecting the first wire bond pads; and
completing electronic testing of each system of integrated first die and second die by bringing microprobes into contact with the input/output bond pads of the plurality of first dies.

* * * * *